United States Patent
Morvan

(10) Patent No.: US 10,854,722 B2
(45) Date of Patent: Dec. 1, 2020

(54) ELECTRONIC COMPONENT WITH A HIGH-ELECTRON-MOBILITY HETEROJUNCTION

(71) Applicant: COMMISSARIAT A L'ENERGIE ATOMIQUE ET AUX ENERGIES ALTERNATIVES, Paris (FR)

(72) Inventor: Erwan Morvan, Montagne (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 16/349,899

(22) PCT Filed: Nov. 8, 2017

(86) PCT No.: PCT/FR2017/053048
§ 371 (c)(1),
(2) Date: May 14, 2019

(87) PCT Pub. No.: WO2018/091799
PCT Pub. Date: May 24, 2018

(65) Prior Publication Data
US 2020/0066891 A1 Feb. 27, 2020

(30) Foreign Application Priority Data
Nov. 15, 2016 (FR) .................... 16 61026

(51) Int. Cl.
*H01L 29/417* (2006.01)
*H01L 29/20* (2006.01)
(Continued)

(52) U.S. Cl.
CPC .... *H01L 29/41775* (2013.01); *H01L 29/2003* (2013.01); *H01L 29/205* (2013.01);
(Continued)

(58) Field of Classification Search
CPC ............. H01L 29/0843; H01L 29/0847; H01L 29/41725; H01L 29/41775;
(Continued)

(56) References Cited

U.S. PATENT DOCUMENTS 9,306,014 B1* 4/2016 Kudymov ............. H01L 29/404
2013/0248873 A1 9/2013 Kuraguchi et al.
(Continued)

OTHER PUBLICATIONS

International Search Report dated Feb. 22, 2018 in PCT/FR2017/053048 filed Nov. 8, 2017.
Nakajima, A. et al., "GaN-Based Super Heterojunction Field Effect Transistors Using the Polarization Junction Concept," IEEE Electron Device Letters, vol. 32, No. 4, Apr. 2011, 3 pages, XP 011363948.
(Continued)

*Primary Examiner* — Eduardo A Rodela
(74) *Attorney, Agent, or Firm* — Oblon, McClelland, Maier & Neustadt, L.L.P.

(57) ABSTRACT

The invention relates to an electronic component with a high-electron-mobility heterojunction. The component includes a superposition of a first semiconductor layer and of a second semiconductor layer, to form an electron-gas layer in proximity to the interface between the first and second semiconductor layers, and first and second conductive metal electrode contacts formed on said second semiconductor layer plumb with the electron-gas layer. At least one of the first and second metal contacts has a contact length L such that $L \leq 1.5 * \sqrt{(\rho c/R2\ Deg)}$, where $\rho c$ is the specific resistance of the metal contact with the electron-gas layer at 425 K and R2 Deg is the sheet resistance in the electron-gas layer at 425 K.

11 Claims, 6 Drawing Sheets

(51) Int. Cl.
| | |
|---|---|
| *H01L 29/205* | (2006.01) |
| *H01L 29/778* | (2006.01) |
| *H01L 29/872* | (2006.01) |
| *H01L 29/66* | (2006.01) |
| *H01L 29/786* | (2006.01) |

(52) U.S. Cl.
CPC .. *H01L 29/41766* (2013.01); *H01L 29/66431* (2013.01); *H01L 29/66462* (2013.01); *H01L 29/7782* (2013.01); *H01L 29/7783* (2013.01); *H01L 29/7786* (2013.01); *H01L 29/78696* (2013.01); *H01L 29/872* (2013.01)

(58) Field of Classification Search
CPC ......... H01L 29/66431; H01L 29/66462; H01L 29/772; H01L 29/7782; H01L 29/7783; H01L 29/7786; H01L 29/78696; H01L 2924/13064
See application file for complete search history.

(56) References Cited

U.S. PATENT DOCUMENTS

| | | | |
|---|---|---|---|
| 2015/0126011 A1 | 5/2015 | Kuraguchi et al. | |
| 2015/0162252 A1* | 6/2015 | Klowak | H01L 23/4824 257/48 |
| 2017/0194476 A1* | 7/2017 | Brueck | H01L 21/02458 |
| 2017/0330940 A1* | 11/2017 | Lee | H01L 29/408 |
| 2018/0138306 A1* | 5/2018 | Jeon | H01L 29/41758 |

OTHER PUBLICATIONS

Miyoshi, M. et al., Device characteristics and performance estimation of nearly lattice-matched InAlN/AlGaN heterostructure field-effect transistors, Journal of Vacuum Science Technology B, vol. 34, No. 5, Sep./Oct. 2016, 4 pages, XP012210758.

Jia, L. et al., "AlGaN/GaN Schottky Diode Fabricated by Au Free Process," IEEE Electron Device Letters, vol. 34, No. 10, Oct. 2013, 3 pages, XP011527882.

Choi, Y. C., et al., "C-doped semi-insulating GaN HFETs on sapphire substrates with a high breakdown voltage and low specific on-resistance," Journal of Vacuum Science Technology B, vol. 25, No. 6, Nov/Dec. 2007, 6 pages, XP012105379.

Fontsere, A. et al., "Temperature dependence of Al/Ti-based Ohmic contract to GaN devices: HEMT and MOSFET," Microelectronic Engineering, vol. 88, 2011, 5 pages, XP 028293384.

Hajlasz, M. et al., "Sheet resistance under Ohmic contacts to AlGan/GaN heterostructures," Applied Physics Letters, vol. 104, 2014, 5 pages, XP012186575.

"EPC2025—Enhancement Mode Power Transistor," eGaN FET Datasheet, EPC—Efficient Power Conversion Corporation, www.epc-co.com, 2015, 6 pages.

"GS66508T Top-side cooled 650 V E-mode GaN transistor Preliminary Datasheet," 2009-2016 GaN Systems Inc., www.gansystems.com, pp. 1-13.

"TPH3205WS GaN Power Low-loss Switch," Transphorm, www.transphormusa.com, Mar. 14, 2016, 8 pp. 1-8.

* cited by examiner

Rc (T) Ohm.mm

ELECTRONIC COMPONENT WITH A HIGH-ELECTRON-MOBILITY HETEROJUNCTION

The invention relates to electronic components with a high electron mobility heterojunction for power applications, and in particular to the optimization of electronic components of this type and of their on-state current.

The performance of many electronic applications now needs to be improved, especially in the case of onboard electronics for automobiles and ground transportation, in aviation, in medical systems or in home automation solutions, for example. Most applications of this type require power changeover switches operating in frequency ranges which often exceed a megahertz.

Historically, for a long time, circuit breakers have employed field effect transistors based on a semiconductor channel, usually silicon. For lower frequencies, junction transistors are preferred because they accommodate higher current densities. However, because such transistors have a relatively limited breakdown voltage, power applications require the use of a large number of transistors in series, or longer transistors, which gives rise to a higher contact resistance. The losses across such transistors in series are considerable, both in the steady state and when switching.

An alternative for circuit breakers, in particular for high frequencies, is the use of HEMT transistors. A transistor of this type has two superimposed layers of semiconductor materials having different bandgaps that form a quantum well at their interface. Electrons are confined in this quantum well in order to form a two-dimensional electron gas. Because of their high voltage and temperature behavior, these transistors are selected in a manner such as to have a wide bandgap.

In particular, HEMT transistors are frequently formed from superimposed layers of semiconductor materials formed from binary or ternary alloys of nitrides of group III elements (for example AlGaN, InAlN, GaN, AlN, etc.). An electron gas layer is formed in the proximity of the interface between these semiconductor material layers.

In the majority of configurations, a transistor of this type comprises a metallic source electrode and a metallic drain electrode formed vertically with respect to the electron gas layer. These electrodes form the current access for the HEMT transistor. A gate electrode is formed between the source and the drain electrodes and can be used to control the current that passes through the electron gas layer between the source and the drain electrodes in a manner that is known per se.

For intermediate voltage levels (typically between 100 and 1200 volts), the linear contact resistance between a source/drain electrode is a decisive parameter which can limit the on-state current of the HEMT transistor. The linear contact resistance (in ohm·cm), designated as Rc, represents a compilation of several different parameters:

the intrinsic performance of the contact, represented by the specific contact resistance, designated as $\rho c$ (in ohm·cm$^2$, for a given operating temperature Tm of the component). The specific contact resistance is representative of the quality of the vertical electron transport at the interface between the metal of the electrode and the electron gas. $\rho c$ is dependent on the fabrication technology of the electrode. As an example, $\rho c$ will be $10^{-5}$ ohm·cm$^2$ for GaN-on-silicon type transistor technology;

the transfer length LT (for a given operating temperature Tm), which is representative of the useful length of the contact in order to guarantee an optimum distribution of the current from the electrode towards the electron gas layer;

the length L (for a given operating temperature Tm), known as the opening of the electrode;

the sheet resistance (or layer resistance) R2 Deg (for a given operating temperature Tm) of the electron gas layer.

What is known as a TLM model of the resistance of the electrode or of the ohmic contact, Rc, is expressed as follows (Rc is the linear contact resistance, expressed here in ohm·mm, corresponding to the gross contact resistance normalized to the contact width, W):

$$Rc = (\coth(L/LT)) * \sqrt{(\rho c * R2 \text{ Deg})}$$

$$LT = \sqrt{(\rho c / R2 \text{ Deg})}$$

The following approximations may be made:
If L>>LT, Rc≈$\rho c$/LT
If L<<LT, Rc≈$\rho c$/L In general, for a given $\rho c$, the smaller that R2 Deg is, the more the current flow will be spread away from the edge of the electrode, and the higher will be the value of LT. As an example, for an electrode technology characterized by $\rho c = 2.5e-5$ ohm·cm$^2$ and a heterojunction characterized by R2 Deg=400 ohm, the following is obtained:

LT=2.5 μm. If L>>LT, Rc=$10^{-3}$ ohm·m or 1 ohm·mm.

In general, minimizing the contribution by the contact resistance Rc of the electrodes to the total on-state resistance Ron is sought, by limiting it to 10%, for example. This is accomplished by employing the criterion L>>LT.

For a transistor technology of the GaN on silicon type, it is not possible to use Au in the electrodes if a transistor that is compatible with CMOS technology is desired. As a consequence, the ohmic contact has a higher $\rho c$, and thus a higher LT. The electrodes of an HEMT transistor of this type thus generally have an opening length L that is at least equal to two times LT in order to limit the contribution of the contact resistance Rc to the resistance Ron.

An HEMT transistor of this type suffers from a major disadvantage. On the one hand, the resistance of the electron gas layer is strongly linked to the electron mobility. Because the electron mobility in the electron gas layer drops sharply with temperature, the on-state resistance Ron is extremely sensitive to temperature. The behavior of the transistor is therefore considerably modified as a function of its operating temperature. On the other hand, the specific on-state resistance Ronsp is not necessarily optimized for high temperature values.

Heterojunction diodes are continuing to be developed in respect of their breakdown voltage, their switch time or their small on-state losses. However, the ohmic contact electrodes for diodes of this type suffer from the same problems as with the electrodes for HEMT transistors.

The aim of the invention is to overcome one or more of these disadvantages. Thus, the invention concerns an electronic component with a high electron mobility heterojunction as defined in the accompanying claim 1.

The invention also concerns variations of the dependent claims. The person skilled in the art will understand that each of the features in respect of variations of the dependent claims may be independently combined with features of the independent claim without in any way constituting an intermediate generalization.

Other characteristics and advantages of the invention will become apparent from the description, which is made below by way of indication and which is not limiting in any way, made with reference to the accompanying drawings in which:

FIG. 1 is a schematic cross-sectional view of an example of a transistor 1 of the HEMT type (also known by the term "high electron mobility field effect transistor" in accordance with one embodiment of the invention.

Figure 1:
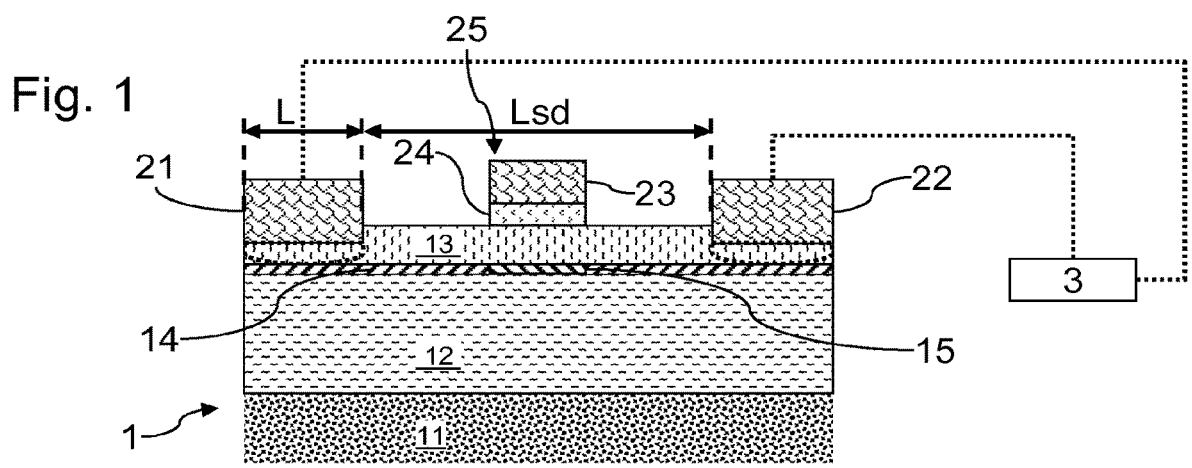
FIG. 1 is a schematic sectional view of an example of an HEMT transistor in accordance with one embodiment of the invention.

The transistor 1 comprises a substrate 11, optionally a buffer layer, not shown, and disposed on the substrate 11, a semiconductor layer 12 (for example of the III-V type, for example a nitride of a group III element, typically GaN), a semiconductor layer 13 formed from another material (for example of the III-V type, for example a nitride of a group III element, typically AlGaN, for which the bandgap is larger than that of the layer 12) and an electron gas layer 14 intrinsically formed in a manner that is known per se in the layer 12 and in the proximity of the interface between the layers 12 and 13. The electron gas layer 14 is conductive in the transistor 1 when in the on-state. The transistor 1 is therefore of the horizontal conduction type, i.e. substantially co-planar with the substrate.

A thin layer of another semiconductor material (not shown) may advantageously be interposed between the layers 12 and 13, in a manner that is known per se (for example a layer of AlN 1 nm in thickness between a layer of GaN and a layer of AlGaN).

The substrate 11 may be an insulator or a semiconductor of the intrinsic or doped silicon type. The substrate 11 may, for example, be of the silicon type with a (111) type lattice orientation. The substrate 11 may also be silicon carbide or sapphire. The substrate 11 may have a thickness of the order of 650 µm, typically in the range 500 µm to 2 mm, depending on the diameter of the substrates.

A buffer layer may be deposited between the substrate 11 and the semiconducting layer 12, in order to manage the mechanical strains (linked to differences in lattice parameters and thermal expansion coefficient, TEC) between the substrate 11 and this semiconducting layer 12. The buffer layer may typically be formed from aluminum nitride, from AlGaN with a decreasing proportion of Al or from a GaN/AlN superlattice.

The semiconductor layer 12 may typically have a thickness in the range 100 nm to 10 µm. The semiconductor layer 12 may be formed in a manner that is known per se, by epitaxial growth on a buffer layer or on the substrate 11. The semiconductor layer 12 is typically a binary alloy of a nitride of a group III element, for example GaN.

The semiconductor layer 13, typically termed the barrier layer, may typically have a thickness in the range 5 nm to 40 nm, for example 25 nm. The semiconductor layer 13 may be formed in a manner that is known per se, by epitaxial growth on the semiconductor layer 12. The semiconductor layer 13 is typically a ternary alloy of a nitride of a group III element, for example AlGaN, or a binary alloy of a nitride of a group III element, for example AlN. The layer 13 must have a bandgap that is larger than that of the layer 12.

In a manner that is known per se, the transistor 1 comprises metallic contacts 21 and 22, forming conduction electrodes. The metallic contacts 21 and 22 are disposed on the semiconductor layer 13. The metallic contacts 21 and 22 are disposed vertically with respect to the electron gas layer 14. The metallic contacts 21 and 22 are each electrically connected to the electron gas layer 14 via a vertical electrical connection (characterized by a specific contact resistance detailed with reference to FIG. 4).

The contacts 21 and 22 in this case are each advantageously formed in a respective recess of the layer 13. One of the metallic contacts is a source contact; the other of these metallic contacts is a drain contact of the transistor 1. A control gate 25 is positioned on the semiconductor layer 13 between the metallic contacts 21 and 22.

The control gate 25 in this case comprises a gate oxide 24 disposed on the semiconductor layer 13. The gate oxide 24 is electrically insulating. A gate metal 23 is disposed on the gate oxide 24. The invention is also applicable to any type of transistor gate, MIS type gate, normally open or type transistor gate or normally closed type transistor gate.

A channel zone 15 is formed vertically with respect to the gate 25, in the electron gas layer 14. In a manner that is known per se, this channel zone 15 is selectively turned on or off, as a function of the polarization-state on the gate 25.

The TLM model expresses the following:
the transfer length $LT=\sqrt{(\rho c/R2\ Deg)}$ (for a given operating temperature Tm of the component, for example 425° C.), representative of the useful contact length for guaranteeing an optimal distribution of the current from one of the electrodes 21 and 22 towards the electron gas layer 14 (the current which drops from one contact towards the electron gas decreases exponentially from the edge of the contact with a characteristic length LT);
the electrode resistance $Rc=(\coth(L/LT))*\sqrt{(\rho c*R2\ Deg)}$ (for a given operating temperature Tm of the component).

$\rho c$ is the value of the function $\rho c(T)$ for a given operating temperature Tm of the component (specific resistance of the contacts 21 and 22); R2 Deg is the value of the function R2 Deg(T) for the operating temperature Tm of the component (linear resistance of the electron gas layer 14).

The dimensions of the transistor 1 in a direction perpendicular to the sectional plane have not been illustrated. This dimension corresponds to the width W of the transistor 1. The transistor 1 usually has a constant width from the contact 21 to the contact 22; its active surface area (and its bulk in this direction) is usually defined by W*(pitch), where "pitch" is the length or the elementary pitch of the transistor, defined as the distance between the two distal ends of the contacts 21 and 22.

The contacts 21 and 22 could be shared with other coupled transistors, and so the length L which is taken into account for the dimensions of a mutual contact of this type will correspond to half the effective length of this contact, this effective length then also corresponding to the length of the opening formed in the passivation layer by etching.

Figure 2:
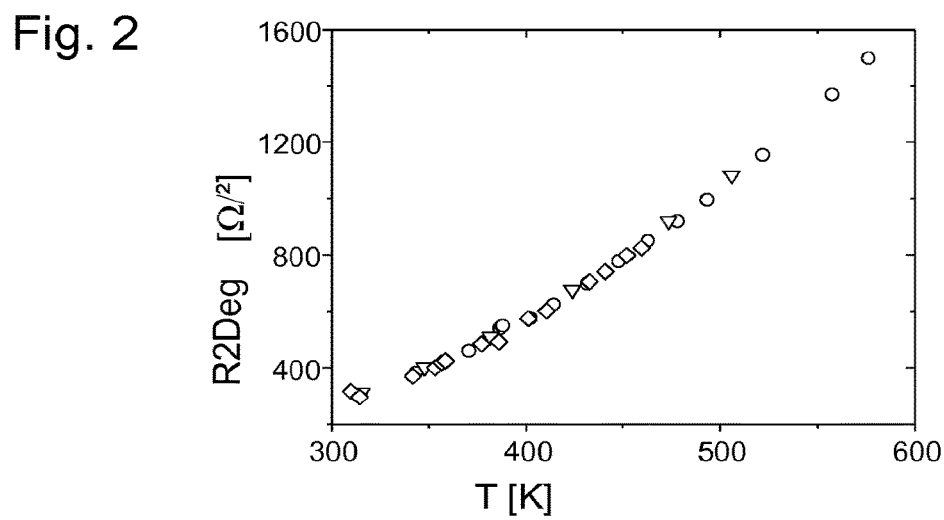
FIG. 2 illustrates an example of the change in linear resistance of an electron gas as a function of temperature.

FIG. 2 illustrates an example of the change in the resistance of the electron gas layer, R2 Deg(T), as a function of temperature. As illustrated, the resistance R2 Deg(T) increases strongly with temperature. This can substantially affect the sensitivity of the operation of the transistor 1 to temperature by altering its on-state resistance. Between a temperature of 293° K and a temperature of 573° K, the resistance R2 Deg is thus multiplied by 5.

Figure 3:
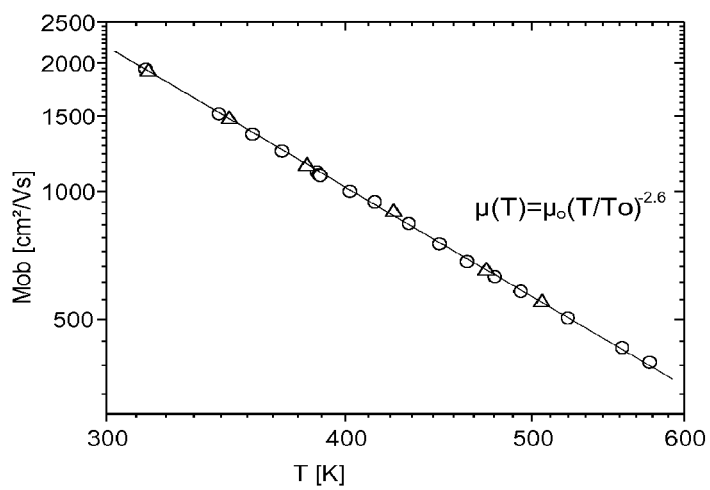
FIG. 3 illustrates an example of the change in the electron mobility in an electron gas layer as a function of temperature.

FIG. 3 illustrates the electron mobility of the electron gas layer 14 as a function of temperature. The electron mobility drops substantially with temperature, which explains the increase in the resistance R2 Deg of the electron gas layer 14 with temperature. The electron mobility μ as a function of temperature has been modeled in this case by the following relationship: $\mu = \mu_0 \cdot (T/T0)^{-2.6}$ (where T0 is the reference temperature for the mobility). It appears to be impossible to dissociate an increase in the resistance R2 Deg of this type with temperature from the physical principles of conduction in an electron gas layer associated with the $Al_xGa_{(1-x)}N/GaN$ heterojunction (diffusion of electrons by optical phonons).

Figure 4:
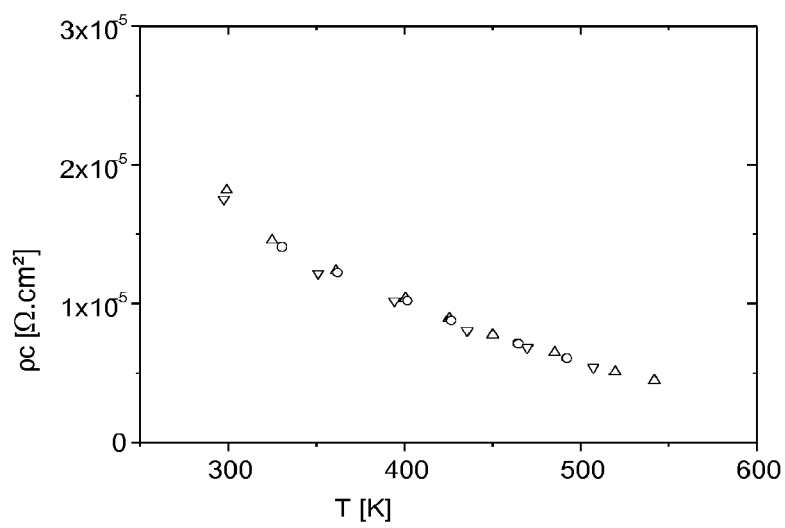
FIG. 4 illustrates an example of the change in the specific contact resistance at the interface between a metallic contact and an electron gas layer as a function of temperature.

FIG. 4 illustrates the change in the function ρc(T) with temperature (the specific contact resistance, which characterizes the electron transport between the metal and the electron gas layer of the subjacent heterojunction). The function ρc(T) decreases strongly with temperature. In accordance with the invention, this property is exploited in order to compensate for the increase in the function R2 Deg(T), the metallic contacts 21 and 22 each having a contact length L such that L≤1.5*√(ρc/R2 Deg), and in particular such that L≤1*√(ρc/R2 Deg). The function ρc(T) may be modeled using an exponential law of the type $a*e^{(b/T)}$, with a and b being constants.

Figure 5:
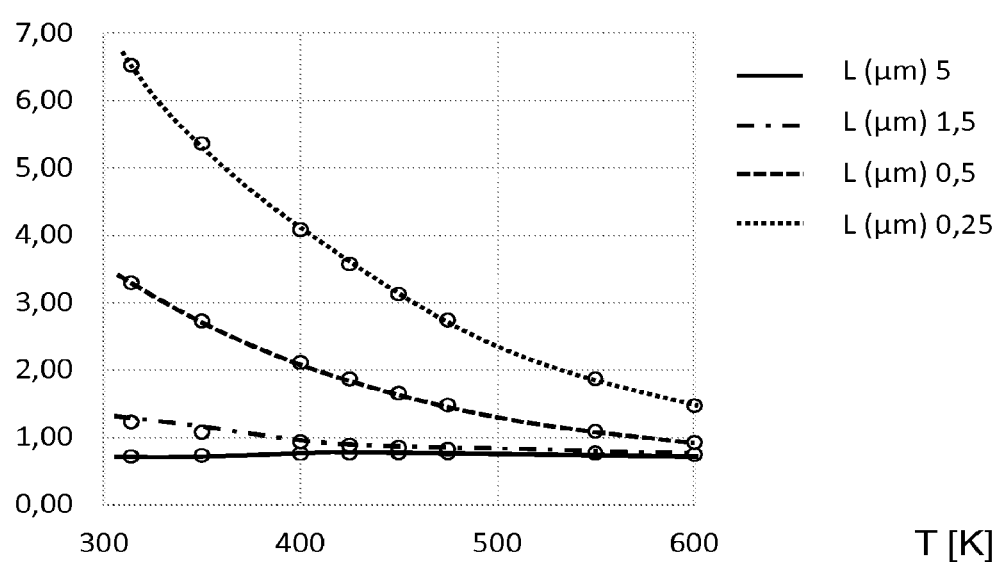
FIG. 5 illustrates different changes in the contact resistance as a function of the temperature and of different contact lengths.
Figure 6:
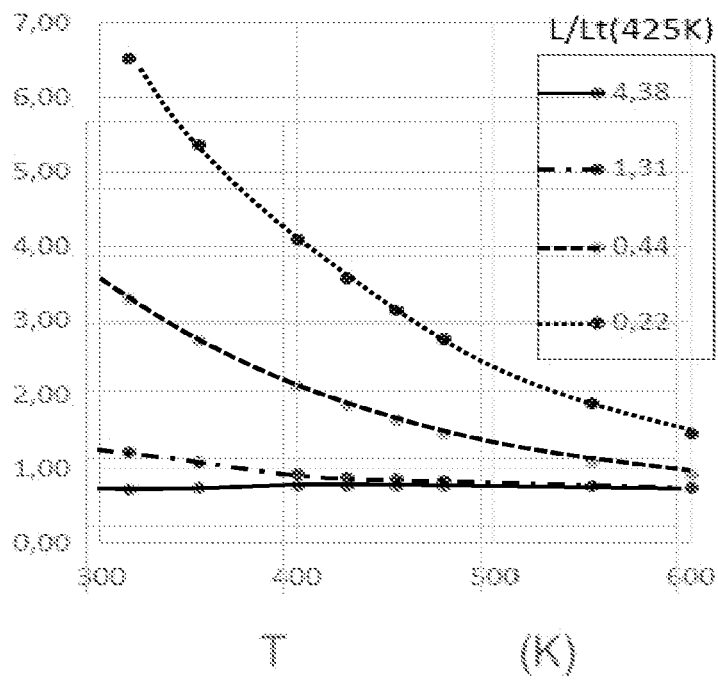
FIG. 6 illustrates different changes in the contact resistance as a function of temperature and of the contact length ratios.

FIG. 5 illustrates different changes in the contact resistances Rc as a function of the temperature, for different values for the contact lengths L. The value of 5 μm for L in this case is more than 2*LT. The value of 1.5 μm here is equal to at most 1.5*LT. FIG. 6 illustrates the change in the contact resistance as a function of temperature, in this case as a function of the ratio L/Lt.

It can be seen that the more truncated the ohmic contact, the more strongly the contact resistance Rc(T) reduces with temperature. This is due both to the fact that the specific contact resistance ρc(T) reduces with temperature and to the fact that the truncation reduces with temperature (Lt(T) reduces). It is this reduction in Rc(T) that can be used to compensate for the increase in R2 Deg(T).

Figure 7:
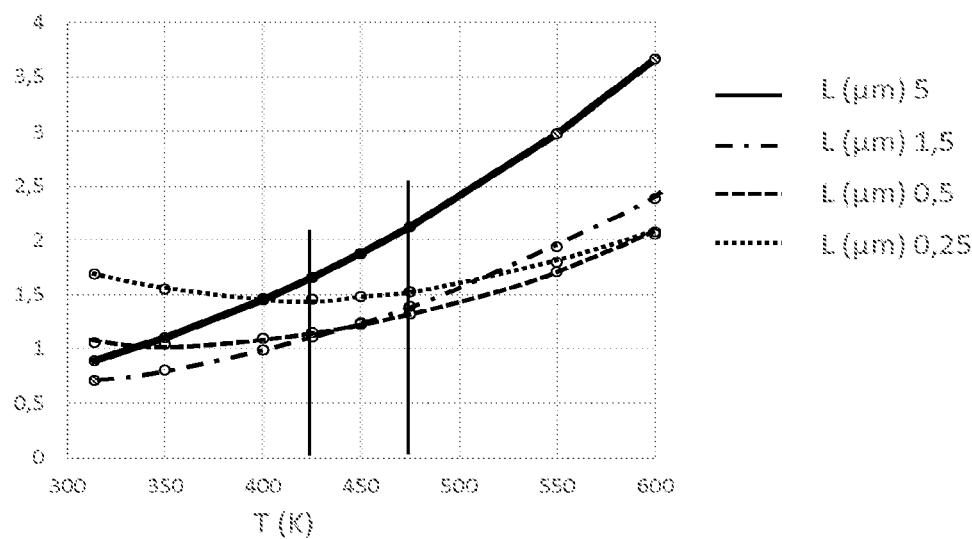
FIG. 7 illustrates an example of the change in the specific on-state resistance of a transistor as a function of temperature and of different contact lengths.

FIG. 7 illustrates an example of the change in specific resistance of a transistor 1 in the on state, as a function of temperature, as a function of different values for L. It can be seen that a transistor with contacts in accordance with the invention can advantageously be used to reduce the sensitivity of its specific resistance to temperature and to reduce the value of Ronsp at high temperatures (operating temperature).

It can be seen that the sensitivity to temperature of the specific resistance of a transistor 1 in the on state is low when L is equal to at most 0.9*LT. in particular, it will be seen that the sensitivity to temperature of the specific resistance of a transistor 1 in the on state is particularly reduced when L is equal to at most 0.5*LT. Thus, in order to reduce the sensitivity to temperature of the specific resistance of the transistor 1 in the on state, advantageously, the contact length L is reduced as much as possible. The invention runs counter to the normal technical view of the person skilled in the art, namely a priori to reduce the contribution of the contact resistance to the resistance in the on-state by increasing the length L of the metallic contacts, in particular when contact materials are used that result in a higher specific contact resistivity (or resistance).

Figure 8:
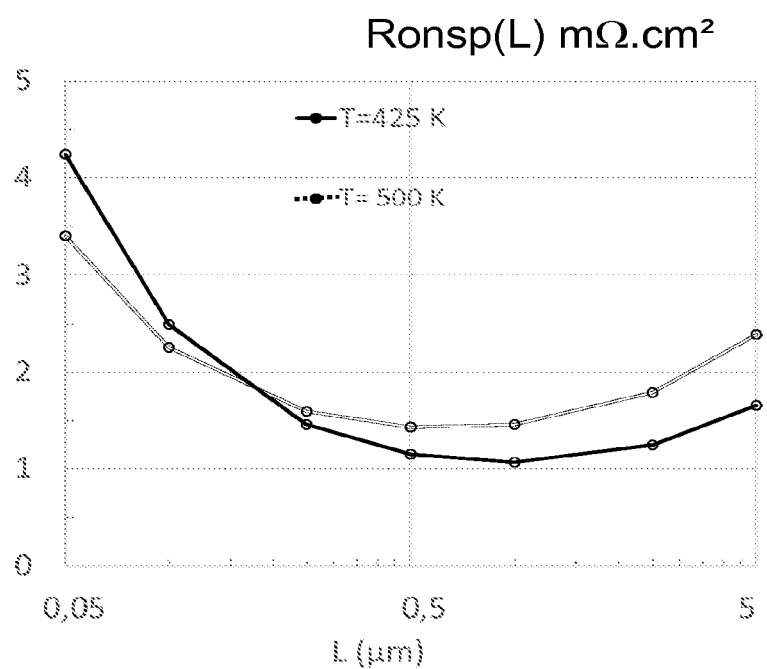
FIG. 8 illustrates the specific on-state resistance of a transistor as a function of contact lengths for different temperature values.

As illustrated with reference to FIG. 8, the specific on-state resistance of transistor 1 may also be reduced at a given operating temperature. Furthermore, as illustrated in FIG. 8, the specific resistance of the transistor 1 is relatively constant with small variations in the contact length L about a value corresponding to the optimal value. Thus, the specific resistance of the transistor 1 is relatively insensitive to variations in its fabrication process affecting its contact length L. This specific resistance of the transistor 1 may be expressed as follows:

$$Ronsp(T,L) = (R_{2\,DEG}(T) * Lsd + 2 * Rc(T,L)) * \text{pitch}$$

In order to provide a minimum specific resistance at a given operating temperature Tn, a less marked truncation is selected corresponding to an optimum at that temperature. Starting from the graph of FIG. 8, the following can be deduced:

an optimum value for L of 0.65 μm at a temperature of 500 K (Ronsp=1.43 mohm·cm²);

an optimum value for L of 1 μm at a temperature of 425 K (Ronsp=1.07 mohm·cm²).

The search for the optimal value of L in order to obtain the minimum specific resistance at a given temperature may be carried out analytically by looking for an approximate solution.

In this regard, the following approximations are made: The calculation of the hyperbolic cotangent coth(x) involved in the calculation of Rc is replaced by its series expansion valid for x<1 (±1.5%):

$$\coth(x) \approx (1/x) + (x/3)$$

The first two terms of the series are used so that the result obtained is not inconsistent.

Let us assume that L<<Lsd (the ohmic contact in principle occupies a reduced space compared with the active portion of the component).

To simplify the notations:
ρc(Tn)=ρ
R2 Deg(Tn)=R
LT(Tn)=LT
Rc(Tn)=Rc

Consequently:

$$LT = \sqrt{(\rho c(Tn)/R2\,Deg(Tn))} = \sqrt{(\rho/R)}$$

Rc is simplified by expanding the hyperbolic cotangent $$Rc \approx \coth(L/LT) * \sqrt{(\rho * R)} \approx ((LT/L) + (L/(3*LT))) * \sqrt{(\rho * R)}$$

Substituting for LT in the preceding expression:

$$Rc \approx (((\sqrt{(\rho/R)})/L)+(L/3*\sqrt{(\rho/R)})))*\sqrt{(\rho*R)}=(\rho/L)+((L*R)/3)$$

Inserting this expression for Rc into Ronsp(Tn):

$$Ronsp(Tn,L)=((R*Lsd)+2*Rc)*(Lsd+(2*L))=((R*Lsd)+(2*(\rho/L)+((L*R)/3))))*(Lsd+(2*L))$$

$$Ronsp(Tn,L)=R*Lsd^2+2*R*Lsd*L+2*Lsd*\rho/L+2*Lsd*L*R/3+4*\rho+4*R*L^2/3$$

By differentiating Ronsp(Tn,L) with respect to L, the following is obtained:

$$dRonsp(Tn,L)/dL=2*R*Lsd+2*R*Lsd/3-2*Lsd*\rho/L^2+8R*L/3=8*R*Lsd/3-2*Lsd*\rho/L^2+8R*L/3$$

Thus, the minimum for Ronsp(Tn,L) is calculated by looking for the zero values for its derivative, i.e.:

$$8*R*Lsd/3-2*Lsd*\rho/L^2+8R*L/3=0, \text{ i.e.}$$

$$Lsd*L^2-3*Lsd*\rho/(4*R)+L^3=0$$

i.e. $L^2*(Lsd+L)=3*Lsd*\rho/(4*R)$

By approximating using Lsd>>L:
then $L^2=3*\rho/(4*R)$
This gives $L=((\sqrt{3})/2)*\sqrt{(\rho/R)} \approx 0.86*LT$.

It is possible, for example, to select a value for L in the range 0.8 to 0.9*LT. The term "Lopt" is used to designate the value obtained for the length L.

In certain cases, the resistance R2 DEG under the ohmic contact is higher than that between the ohmic contact pins if the process for the fabrication of the ohmic contact modifies the electron gas under the contact. It can readily be seen that the calculation developed above remains valid because L remains sufficiently small compared with Lsd. The condition for this approximation to remain valid is if the following inequality is respected:

$$L<<Lsd*(3*(((3*R1)/R2)+1)/4)$$

in which R1 is the resistance of the electron gas layer beyond the contact and R2 is the resistance of the electron gas layer under the contact.

The calculation of the sensitivity of the Ronsp (Tm) as a function of the variations about the value L starting from the value may be carried out as follows. For this purpose, Ronsp(Tm, L) may be expanded in a Taylor series around the value Lopt:

$$Ronsp(L) \approx Ronsp(Lopt)+R'onsp(Lopt)*(L-Lopt)+0.5*R''onsp(Lopt)*(L-Lopt)^2$$

in which R'onsp(Lopt)=dRonsp(Lopt)/dL and $$R''onsp(Lopt)=d^2Ronsp(Lopt)/dL^2$$

R'onsp(Lopt) is zero for the desired minimum, and so the relationship can be expressed as:

$$Ronsp(L) \approx Ronsp(Lopt)+0.5*R''onsp(Lopt)*(L-Lopt)^2$$

The sensitivity may therefore be expressed as follows:

$$(Ronsp(L)-Ronsp(Lopt))/Ronsp(Lopt) \approx 0.5*R''onsp(Lopt)*(L-Lopt)^2/Ronsp(Lopt)$$

In order to calculate the numerator:

$$R''onsp(L)=d(R'onsp(L))/dL=d(8*R*Lsd/3-2*Lsd*\rho/L^2+8R*L/3)/dL=4*Lsd*\rho/L^3+8R/3$$

Thus, $R''onsp(Lopt)=4*Lsd*\rho/Lopt^3+8R/3$

By substituting Lopt and p for their expressions as functions of LT, the following is obtained:

$$R''onsp(Lopt)=8*R*(4*Lsd/(\sqrt{3}*LT)+1)/3 \approx 8*R*(4*Lsd/(\sqrt{3}*LT))/3$$

In order to calculate the denominator:

$$Ronsp(Lopt) \approx Lsd*((R*Lsd)+(2*\rho/Lopt)\pm(2*Lopt*R/3))/3$$

By substituting Lopt and p for their expressions expressed as functions of LT, the following is obtained:

$$Ronsp(Lopt) \approx Lsd*R*(Lsd+5*LT/\sqrt{3})$$

The sensitivity may therefore be expressed as follows:

$$(Ronsp(L)-Ronsp(Lopt))/Ronsp(Lopt) \approx 3.08*(L-Lopt)^2/(Lsd*LT+2.88*LT^2)$$

As an example, when Lds=10 µm, LT=1 µm and with a variation of 0.1 µm in the value of (L−Lopt), a sensitivity of 0.24% is obtained for Ronsp. Thus, a contact is obtained that is relatively insensitive to temperature as regards variations in its fabrication process causing errors in the value of L.

Figure 9:
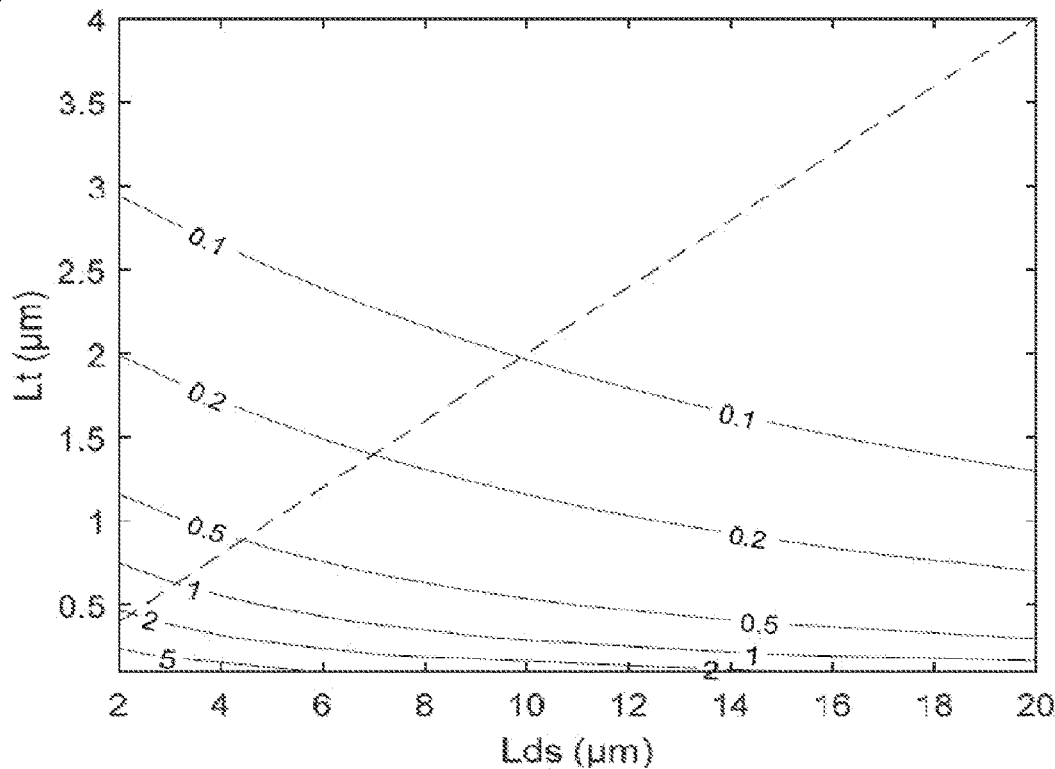
FIG. 9 illustrates an example of a diagram of the percentage increase in the specific on-state resistance as a function of parameters.

FIG. 9 illustrates an example of a graph of the percentage increase in Ronsp as a function of Lds and LT. The broken line corresponds to the limit of validity for the approximation LT>5*Lds.

In order to provide a specific resistance having a minimum dependence upon temperature, a numerical optimization may be carried out as follows:

The models for $\rho c(T)$ and $R_{2\ DEG}(T)$ are already known for a given technology, for example from previous measurements. The desired value L may be resolved numerically from the following relationship:

$$Ronsp(Tm,L)=(R_{2\ DEG}(Tm)*Lsd+2*Rc(T0,L))*(Lsd+2*L)$$

In which $Rc(T)=(\coth(L/LT(T)))*\sqrt{(\rho c(T)*R2\ Deg(T))}$ and
$LT(T)=\sqrt{(\rho c(T)/R2\ Deg(T))}$ Studying the graph, it can be seen that a value for L of 0.5 µm will provide excellent temperature stability over a range between 425 and 500K.

An example of a calculation for determining a value for Lcib leading to a low sensitivity for Ronsp over a range of temperatures between two limits T1 and T2 will now be given.

Tm means the following:

$$Tm=(T1+T2)/2$$

The value for L that cancels dRonsp(T)/dT for Tm is sought; this corresponds to a minimum variation about this temperature value.

Starting again from the expression:

$$Ronsp\ (Tm,\ L) = R*Lsd^2 + 2*R*Lsd*L +$$
$$2*Lsd*\rho/L + 2*Lsd*L*R/3 + 4*\rho + 4*R*L^2/3$$

$$\frac{dRonsp(T,L)}{dT}(Tm) = \left(Lsd^2 + \frac{8}{3}*L*Lsd + \frac{4}{3}L^2\right)\frac{dR}{dT} + \left(2*\frac{Lsd}{L}+4\right)\frac{d\rho}{dT}$$

Thus, the value of L is sought that cancels this derivative for the value Tm.

The following models will be used for R(T) and ρ(T):

$$R(T)=a*T^b$$

$$\rho(T)=c*e^{-dT}$$

in which
a=$8^{e-5}$ ohm/K$^b$; b=2.63517; c=$9.23^{e-5}$ ohm·cm$^2$ and d=$5.5272^{e-3}$ K$^{-1}$ With the approximation L<<Lsd, the following is obtained:

$$(Lcib) = 2 * \frac{d}{b} * Tm * \frac{LT^2(Tm)}{Lsd}$$

With the parameters detailed above, for example, the following is found: Lcib=0.295 μm for Tm=400K and Lsd=10 μm.

Figure 10:
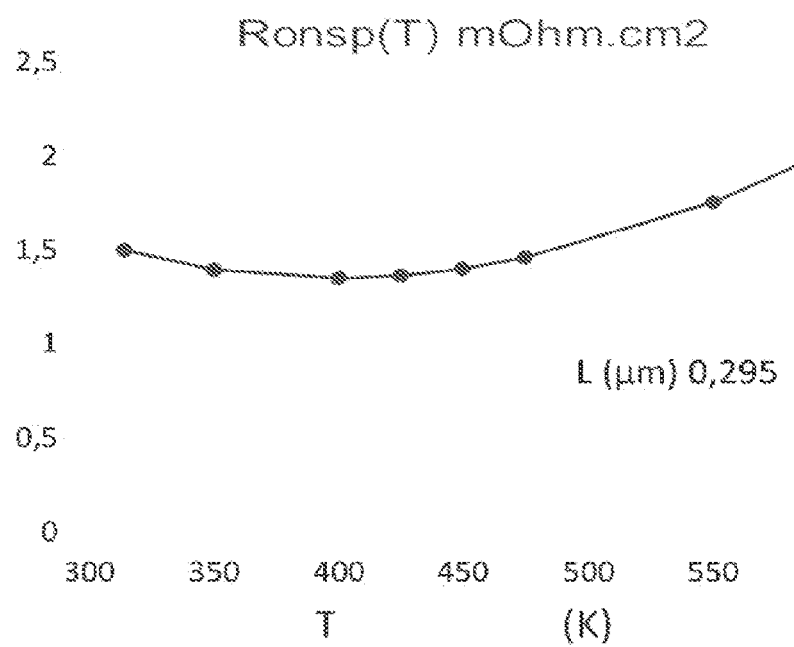
FIG. 10 illustrates an example of specific on-state resistance for parameters optimizing its stability in a given temperature range.

An example of Ronsp(T) with these parameters is illustrated in FIG. 10. The very small variation in Ronsp about the value of T=400K can easily be seen.

The sensitivity of Ronsp (Tm) with respect to the value L may be expressed by the following relationship:

$$\frac{Ronsp(L) - Ronsp(Lcib)}{Ronsp(Lcib)} \approx \frac{(L - Lcib)^2}{\left(\frac{d}{b}Tm + 1\right) * \left(\frac{2d}{b}Tm\frac{LT^2(Tm)}{Lsd}\right)}$$

After simulation, with an error of L-Lcib of 0.05 μm, Ronsp has a variation of less than 10% for a very wide range of values of LT and Lsd.

Advantageously, the metallic contacts 21 and 22 are not produced from gold in order to keep the process for the fabrication of the transistor 1 CMOS-compatible. The metallic contacts 21 and 22 are advantageously produced from a metal selected from the list constituted by alloys of Al/Ti, Al/Ta, Al/V or Ti/N, because of the reduced specific resistivity of the interface between the alloy formed and the electron gas.

Figure 11:
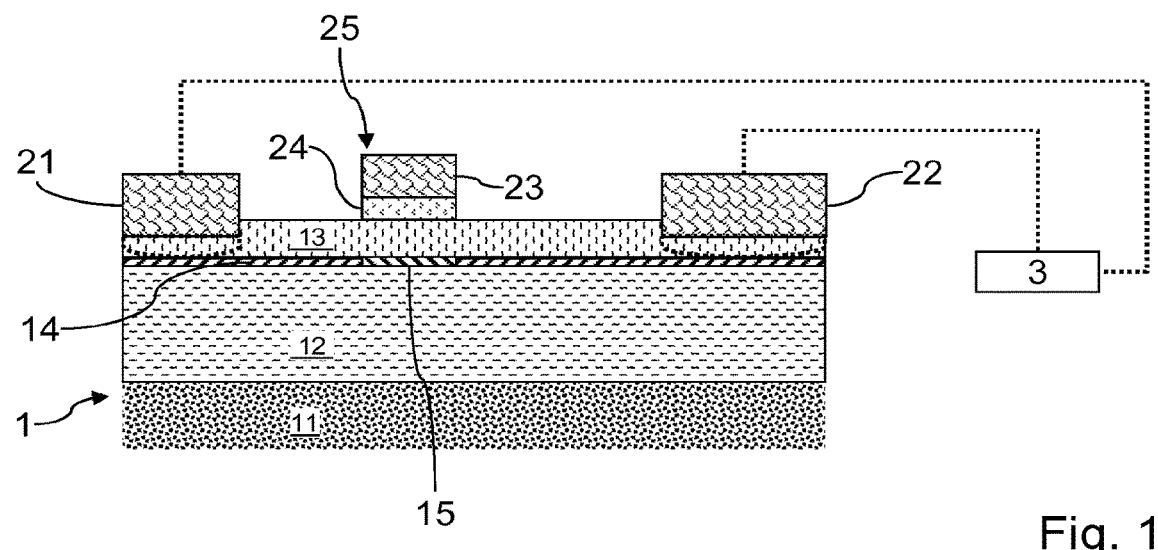
FIG. 11 is a schematic sectional view of an example of an HEMT transistor in accordance with a further embodiment of the invention.

FIG. 11 is a schematic cross-sectional view of an example of an HEMT type transistor 1 in accordance with one embodiment of the invention. This transistor 1 differs from that illustrated in FIG. 1 in that the metallic contacts 21 and 22 have different lengths. The metallic contact 22 in this case is longer than the metallic contact 21. Such a lack of symmetry between the metallic contacts may, for example, be used to favor a contact resistance that is as low as possible for the contact 22, and a contact 21 compensating for the variation in the resistance of the electron gas layer with temperature. As an example, a source may be provided which has a higher contact resistance than that of the drain.

Clearly, the invention is applicable to any other electronic component with a high electron mobility heterojunction, in particular to a heterojunction diode.

Figure 12:
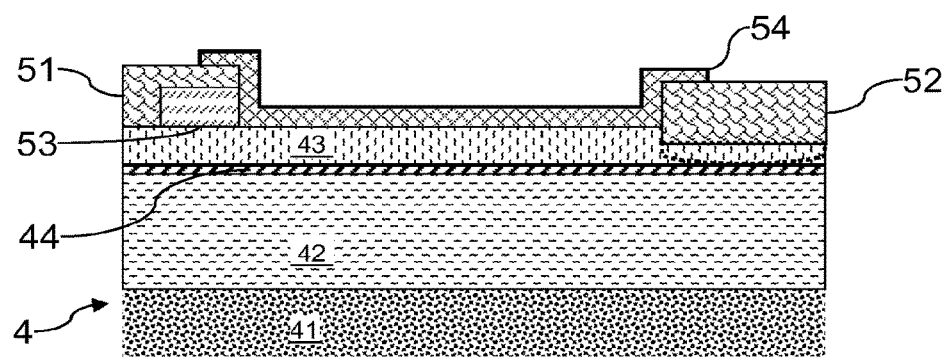
FIG. 12 is a schematic sectional view of an example of a heterojunction diode in accordance with a further embodiment of the invention.

FIG. 12 is a schematic sectional view of an example of a high electron mobility heterojunction diode 4 in accordance with another embodiment of the invention.

The diode 4 comprises a substrate 41, optionally a buffer layer, not shown, and disposed on the substrate 41, a semiconductor layer 42 (for example of the III-V type, for example a nitride of a group III element, typically GaN), a semiconductor layer 43 formed from another material (for example of the III-V type, for example a nitride of a group III element, typically AlGaN, for which the bandgap is larger than that of the layer 42), and an electron gas layer 44 intrinsically formed in the layer 42 in a manner that is known per se and in the proximity of the interface between the layers 42 and 43. The electron gas layer 44 is intended to make the diode 4 conductive in the on state. The diode 4 is thus of the horizontal conduction type, i.e. substantially coplanar with the substrate 41.

A thin layer of another semiconductor material (not shown) may advantageously be interposed between the layers 42 and 43 in a manner that is known per se (for example a 1 nm thick layer of AlN between a layer of GaN and a layer of AlGaN).

The substrate 41 may be an insulator or a semiconductor of the intrinsic or doped silicon type. The substrate 41 may, for example, be of the silicon type with a (111) lattice orientation. The substrate 41 may also be silicon carbide, or sapphire. The substrate 41 may have a thickness of the order of 650 μm, typically in the range 500 μm to 2 mm, depending on the diameter of the substrates.

A buffer layer may be deposited between the substrate 41 and the semiconductor layer 42, in order to manage the mechanical strains (linked to differences in the lattice parameters and the thermal expansion coefficient, TEC) between the substrate 41 and this semiconductor layer 42. The buffer layer may typically be formed from aluminum nitride, from AlGaN with a decreasing proportion of Al, or as a GaN/AlN superlattice.

The semiconductor layer 42 may typically have a thickness in the range 100 nm to 10 μm. The semiconductor layer 42 may be formed in a manner that is known per se, by epitaxial growth onto a buffer layer or onto the substrate 41. The semiconductor layer 42 is typically a binary alloy of a nitride of a group III element, for example GaN.

The semiconductor layer 43 may typically have a thickness in the range 5 nm to 40 nm, for example 25 nm. The semiconductor layer 43 may be formed in a manner that is known per se, by epitaxial growth onto the semiconductor layer 42. The semiconductor layer 43 is typically a ternary alloy of a nitride of a group III element, for example AlGaN, or a binary alloy of a nitride of a group III element, for example AlN. The layer 43 must have a bandgap which is larger than that of the layer 42.

The diode 4 comprises metallic contacts 51 and 52 (respectively the anode and cathode) in a manner that is known per se, forming conduction electrodes. The metallic contact is disposed on the semiconductor layer 43. The metallic contact 51 is disposed vertically with respect to the electron gas layer 54. The metallic contact 52 is electrically connected to the electron gas layer 44, via a vertical electrical connection. The metallic contact 52 in this case is advantageously formed in a recess of the layer 43. An insulating layer 54 is formed on the layer 43 between the electrodes 51 and 52. A semiconducting zone 53 with P type doping is covered by the electrode 51 and is in contact with the layer 43.

The dimensions of the electrode 52 could, for example, be identical to those detailed for the contacts 21 and 22 of the transistor 1 detailed above.

The invention claimed is:

1. An electronic component with a high electron mobility heterojunction, comprising:
   a first layer of semiconductor material superimposed on a second layer of semiconductor material, to form an electron gas layer in the proximity of the interface between the first and second layers of semiconductor material, the first and second layers of semiconductor material including a nitride;
   first and second metallic contacts of conduction electrodes formed on said second layer of semiconductor material vertically with respect to the electron gas layer;
   wherein:
   at least one of said first and second metallic contacts has a contact length L such that $L \leq 1.5 * \sqrt{(\rho c / R2 \, Deg)}$;

in which ρc is the specific resistance of said metallic contact with the electron gas layer at 425K, in which R2 Deg is the sheet resistance in the electron gas layer at 425K.

2. The electronic component with a high electron mobility heterojunction as claimed in claim 1, wherein at least one of said first and second metallic contacts has a contact length L such that L≤0.9*√(ρc/R2 Deg).

3. The electronic component with a high electron mobility heterojunction as claimed in claim 2, wherein at least one of said first and second metallic contacts has a contact length L such that L≤0.5*√(ρc/R2 Deg).

4. The electronic component with a high electron mobility heterojunction as claimed in claim 2, wherein at least one of said first and second metallic contacts has a contact length comprised between 0.8*√(ρc/R2 Deg) and 0.9*√(ρc/R2 Deg).

5. The electronic component with a high electron mobility heterojunction as claimed in claim 1, wherein the first layer of semiconductor material is formed from GaN, and in which the second layer of semiconductor material is formed from AlGaN.

6. The electronic component with a high electron mobility heterojunction as claimed in claim 1, wherein the distance between said first and second metallic contacts is equal to at most 20 μm.

7. The electronic component with a high electron mobility heterojunction as claimed in claim 1, wherein said first and second metallic contacts are formed from a metal selected from the list constituted by Al/Ti, Al/Ta, Al/V or Ti/N alloys.

8. The electronic component with a high electron mobility heterojunction as claimed in claim 1, wherein said second layer of semiconductor material is provided with recesses in which said first and second contacts are disposed.

9. The electronic component with a high electron mobility heterojunction as claimed in claim 1, wherein the electronic component is a heterojunction field effect transistor.

10. The electronic component with a high electron mobility heterojunction as claimed in claim 1, wherein the electronic component is a heterojunction diode.

11. A system comprising:

an electronic component with a high electron mobility heterojunction as claimed in claim 1;

an electrical supply configured to apply a potential difference wherein the maximum amplitude is comprised between 100 and 1200 volts between the first and second metallic contacts of said electronic component.

* * * * *